United States Patent [19]
Ogino et al.

[11] Patent Number: 5,331,256
[45] Date of Patent: Jul. 19, 1994

[54] FOCUS YOKE, ELECTROMAGNETICALLY FOCUSED CRT DISPLAY WITH THE FOCUS YOKE, AND NEGATIVE FEEDBACK CIRCUIT WITH STRAY-CAPACITOR-CANCELLATION MEANS USED FOR THE CRT DISPLAY OR THE LIKE

[75] Inventors: Masanori Ogino; Miyuki Ikeda; Toshiyuki Kimoto, all of Yokohama, Japan

[73] Assignee: Hitachi, Ltd., Tokyo, Japan

[21] Appl. No.: 991,488

[22] Filed: Dec. 15, 1992

[30] Foreign Application Priority Data

Dec. 26, 1991 [JP] Japan ................... 3-356727

[51] Int. Cl.⁵ .................. G09G 1/04; H01J 29/06; H01J 29/46
[52] U.S. Cl. ..................... 315/382; 315/8; 315/389; 313/442
[58] Field of Search .......... 315/382, 387, 389, 8; 335/210, 213, 214; 307/91; 336/110; 313/442

[56] References Cited
U.S. PATENT DOCUMENTS

| | | | |
|---|---|---|---|
| 3,466,499 | 9/1969 | Beth | 313/422 |
| 4,198,592 | 4/1980 | Miyoshi et al. | 315/382 |
| 4,388,619 | 6/1983 | Beck | 315/382 |
| 4,546,291 | 10/1985 | Morioka et al. | 315/382 |

FOREIGN PATENT DOCUMENTS 2458126  6/1976  Fed. Rep. of Germany ...... 315/387

Primary Examiner—Gregory C. Issing
Attorney, Agent, or Firm—Antonelli, Terry, Stout & Kraus

[57] ABSTRACT

A focus yoke used for an electromagnetically focused CRT display comprises: a cylindrical permanent magnet unit which is disposed around a neck portion of a CRT and is spaced from the circumference of the neck portion; a core unit which defines a toroidal space together with the cylindrical magnet unit for substantially surrounding the neck portion, the core unit forming a magnetic path to guide magnetic lines of force generated by the cylindrical magnet unit; a dynamic focus winding unit disposed in the toroidal space; and a winding unit disposed externally of said toroidal space for eliminating an undesired magnetic field of an inverse polarity generated due to the cylindrical magnet unit.

19 Claims, 13 Drawing Sheets

FIG. 15 (PRIOR ART)

△ : DISADVANTAGE  ○ : ADVANTAGE

| TYPES | SOLENOID CURRENT TYPE | PERMANENT MAGNET TYPE |
|---|---|---|
| WEIGHT (OF FOCUS YOKE) | △ EXESSIVELY HEAVY (ABOUT 1.5Kg) | ○ (ABOUT 300g) |
| FOCUS PERFOMANCE | ○ EXCELLENT | △ (SPHERICAL ABERRATION) |
| POWER CONSUMED FOR DINAMIC FOCUSSING | △ EXESSIVELY HIGH | △ HIGH |
| NUMBER OF SETS OF INDEPENDENT WINDINGS WHICH FORM DINAMIC FOCUS WINDING | △ 2 SETS *1 | △ 2 SETS *2 |

*1 FIRST SET : DC/LOW FREQUENCY WINDINGS
   SECOND SET : HIGH FREQUENCY (HORIZONTAL FREQUENCY) WINDINGS

*2 FIRST SET : LOW FREQUENCY WINDINGS
   SECOND SET : HIGH FREQUENCY WINDINGS

FOCUS YOKE, ELECTROMAGNETICALLY FOCUSED CRT DISPLAY WITH THE FOCUS YOKE, AND NEGATIVE FEEDBACK CIRCUIT WITH STRAY-CAPACITOR-CANCELLATION MEANS USED FOR THE CRT DISPLAY OR THE LIKE

BACKGROUND OF THE INVENTION

The present invention relates to a focus yoke, an electromagnetically focused CRT display with the focus yoke, and a negative feedback circuit with stray-capacitor-cancellation means used for the CRT display or the like.

Electromagnetically focused CRTs heretofore include two types, one being solenoidal current type and the other being cylindrical permanent magnet type (hereinafter simply referred to as permanent magnet type).

A typical CRT and peripheral components thereof are shown in FIG. 12. In FIG. 12, a reference numeral 1 denotes a CRT, 2 a deflection yoke (hereinafter referred to as DY), 3 a focus yoke (hereinafter referred to as FY), 4 an electron gun, 5 a neck portion.

The focus yoke 3 functions as an electron lens for converging electron beams as represented by arrows in FIG. 12.

A sectional structure of a solenoid current type focus yoke and the distribution of the magnetic field along the axis of the neck portion 5 of this type of the CRT are shown in FIGS. 13A and 13B, respectively.

A sectional structure of a permanent magnet type of focus yoke and the distribution of the magnetic field along the axis of the neck portion 5 are shown in FIGS. 14A and 14B, respectively.

In FIGS. 13A and 14A, a reference numeral 6 denotes a magnet path forming magnetic core comprising a soft magnetic material, 7 a winding, 8 a permanent magnet. Marks in circles of the winding 7 denote the direction of currents. Arrows in the neck portion 5 denote the direction of magnetic field. A curve 9 in FIG. 13B denotes the magnetic field distribution in the solenoid current type CRT and a curve (solid line) 10 and a curve (dotted line) 11 in FIG. 13B denote the magnetic field distributions in the permanent magnet type, respectively.

FIGS. 13A and 14A correspond to FIGS. 13B and 14B in positional relation in an axial direction of the CRT, respectively.

In the permanent magnet type CRT of FIG. 14A, the winding 7 is provided for so-called dynamic focussing, that is for dynamically changing a focussing force depending upon the position on a screen.

Problems of the above mentioned prior art are listed in FIG. 15. These problems will be described.

Focussing performance of each of the above mentioned focus yokes will be described. In the permanent magnet type CRT, a magnetic field of an inverse polarity (magnetic field components having a desired direction and the opposite direction) is inevitably generated as is apparent from the curve 11 in FIG. 14B. The magnetic component of the inverse polarity will cause spherical aberration in an electromagnetic lens. Accordingly, the permanent magnetic type CRT has a problem that the focussing performance on a screen deteriorates. The solenoid current type CRT has excellent focussing performance since no magnetic field of the inverse polarity is generated so that the spherical aberration is less as is apparent from the curve 9 in FIG. 13B.

The solenoid current type focus yoke shown in FIG. 13A is excessively heavy while the permanent magnet type focus yoke shown in FIG. 4A is light.

The solenoid current type focus yoke consumes very much electric power for dynamic focussing and the permanent magnet type focus yoke also consumes much electric power.

In the focus yoke shown in FIG. 13A, the winding 7 comprises two sets of windings which are independent of each other. That is, the focus yoke shown in FIG. 13A comprises a first set of windings (D.C. and low frequency windings) which are externally disposed and a second set of windings (high frequency horizontal scanning windings) which are internally disposed. The focus yoke shown in FIG. 14A also comprises two sets of windings which are independent of each. That is, the focus yoke shown in FIG. 14A comprises a first set of windings (low frequency windings) which are externally disposed and a second set of windings (high frequency windings) which are internally disposed.

The reasons why the diameter of the core 6 is so large that a useless space is formed therein in the structure shown in FIG. 14A are as follows: That is, reduction in the space in the core 6 by decreasing the diameter of the core 6 is effective to reduce the wastfull magnetic energy and the consumed electric power. On the other hand, decreasing of the diameter of the core 6 will enlarge the curve 11 in FIG. 14B in the inverse polarity direction to provide a remarkably large spherical aberration.

SUMMARY OF THE INVENTION

It is therefore an object of the present invention to provide a focus yoke which is capable of reducing spherical aberration to provide excellent focus performances and reducing consumed electric power for dynamic focussing and an electromagnetically focused CRT display.

It is another object of the present invention to provide an electromagnetically focused CRT display in which a dynamic focus winding can be constituted by a set of winding.

It is still another object of the present invention to provide an electromagnetically focused CRT display which can automatically compensate for the thermal characteristics of a magnet so that spherical aberration can be reduced independently of temperature.

It is a further object of the present invention to provide an electromagnetically focused CRT display which is easy for maintenance and adjustment.

It is a further object of the present invention to provide an electromagnetically focused CRT display in which undesired parasitic ringing due to a stray capacitor included in a dynamic focus winding can be prevented.

It is a further object of the present invention to provide an electromagnetically focused CRT display which can equivalently eliminate a voltage which is fed back via a stray capacitor included in a dynamic focus winding and a negative feedback circuit with stray capacitor-cancellation means which can be used for the CRT display and the like.

In order to accomplish the above mentioned objects in an aspect of the present invention, there is provided a focus yoke comprising: a cylindrical permanent magnet unit which is disposed around a neck portion of a CRT, and is spaced from the circumference of the neck portion; a core unit which defines a toroidal space substantially enclosed around the neck portion together with the circumference of the neck portion and the cylindrical magnet unit, the core unit forming a magnetic path to guide magnetic lines of force generated by the cylindrical magnet unit; a dynamic focus winding unit disposed in the toroidal space; and an eliminating winding unit disposed externally of the toroidal space for eliminating an undesired magnetic field of an inverse polarity generated due to the cylindrical magnet unit.

Since this focus yoke has the eliminating winding unit although it has the cylindrical permanent magnet unit, the spherical aberration which is inherent in the permanent magnet type CRT can be reduced. Although reduction in the volume of the inner space (the toroidal space) in the core unit increases the magnetic field of the inverse polarity generated due to the cylindrical permanent magnet unit similarly to the above mentioned prior art permanent magnet type CRT, the magnetic field of the inverse polarity can be eliminated by the eliminating winding unit. Accordingly, the volume of the inner space of said core unit can be reduced while reducing the spherical aberration. As a result, reduction in electric power consumed for dynamic focussing can be achieved as well as reduction in the spherical aberration.

The eliminating winding unit may be disposed in at least one of the opposite sides of the core unit which are in an axial direction of the neck portion.

The core unit may include an extension which extends in at least one direction externally of the toroidal space substantially in parallel with the axis of the neck portion. In this case, the extension may be magnetically coupled with the other magnetic member disposed around the neck portion.

The dynamic focus winding unit may be supplied with a high frequency dynamic focus current, the eliminating winding unit may be also supplied with a low frequency dynamic focus current, whereby the eliminating winding unit may be also used as second dynamic focus winding unit.

The dynamic focus winding unit may comprise a plurality of sets of windings or one set of winding.

In another aspect of the present invention, there is provided an electromagnetically focused CRT display including a focus yoke, the focus yoke comprising: a cylindrical permanent magnet unit which is disposed around a neck portion of a CRT and is spaced from the circumference of the neck portion; a core unit which defines a toroidal space substantially enclosed around the neck portion together with the circumference of the neck portion and the cylindrical magnet unit, the core unit forming a magnetic path to guide magnetic lines of force generated by the cylindrical magnet unit; a dynamic focus winding unit disposed in the toroidal space; and an eliminating winding unit disposed externally of the toroidal space for eliminating an undesired magnetic field of an inverse polarity generated due to the cylindrical magnet unit.

The electromagnetically focused CRT display may further include a first driving unit for applying a current having at least a direct current component to the eliminating winding unit.

The first drive unit may include a temperature compensating unit for compensating for thermal characteristics of the cylindrical magnet unit. In this case, the thermal characteristics of the cylindrical permanent magnet unit can be automatically compensated for, so that the spherical aberration can be reduced independently of temperature. The temperature compensating unit may include a diode.

The first drive unit may also apply a low frequency dynamic focus current to the eliminating winding unit.

The electromagnetically focused CRT display may further include second drive unit for applying a high frequency current of parabolic wave shape having at least a horizontal scanning period to the dynamic focus winding unit.

The second drive unit may include a low frequency blocking capacitor which is in series connected with the dynamic focus winding unit.

The second drive unit may comprise: a first amplifier unit which is operated at a first power supply voltage; a second amplifier unit which is operative at a second power supply voltage which is lower than the first power supply voltage, the output of the second amplifier unit being adapted to substantially drive the dynamic focus winding unit on current source basis; a low frequency blocking capacitor which is in series connected between the output of the first amplifier unit and the dynamic focus winding unit; and a low pass filter unit for low-pass-filtering the output of the first amplifier unit, the output of the low pass filtering unit being connected with the input of the second amplifier unit. In this case, both the low frequency dynamic focus current and the high frequency dynamic focus current may be conducted through a set of windings. Accordingly, the dynamic focus winding unit may comprise a set of windings. Since the first amplifier unit is operative at a low voltage supply voltage in this case, an electric power which is necessary to conduct the low frequency current through the dynamic focus winding unit is reduced, resulting in that the electric power consumed for dynamic focussing can be further reduced.

The second drive unit may include a unit for generating a signal corresponding to the high frequency current of a parabolic wave shape. The generating unit comprises a resistor unit for detecting a voltage which is proportional to a current flowing through a horizontal deflection coil; a squaring circuit unit for squaring the voltage detected by the resistor unit; and a unit for outputting the output of the squaring circuit unit in a period other than the horizontal retrace period and for outputting a predetermined value in the horizontal retrace period. In this case, the voltage which is detected by the resistor unit may be used as a saw-toothed wave for a horizontal automatic frequency control circuit.

The electromagnetically focused CRT display may further include a unit for allowing the focus condition in the peripheral area of a screen to be adjusted depending upon the change of the amplitude of the high frequency current of parabolic wave shape and for keeping the fixed focus condition in the central area of the screen independently of the change in amplitude of the current. In this case, since the focus condition in the peripheral area of the screen can be changed while keeping the fixed focus condition in the central area of the screen, maintenance and adjustment of the image is easy.

The electromagnetically focused CRT display may further include: a capacitor unit which resonates with an inductor of the dynamic focus winding unit when the capacitor unit is connected in parallel with the dynamic focus winding unit; and a switching unit for connecting the capacitor unit in parallel with the dynamic focus winding unit only in the horizontal retrace period. In this case, undesired ringing due to a stray capacitor associated with in the dynamic focus unit is prevented.

The second drive unit may include an amplifier unit having non-inverted and inverted input terminals and an output terminal; and a resistor unit which is in series connected with the dynamic focus winding unit, the resistor unit detecting a voltage which is proportional to current flowing through the dynamic focus winding unit. In this case, the voltage which is detected by the resistor unit is fed back to the inverted input terminal of the amplifier unit. At least a compensating capacitor unit is in series connected between the output terminal and the non-inverted input terminal of the amplifier unit to reduce a signal fed back to the amplifier unit via the stray capacitor associated with the dynamic focus winding unit. In this case, the voltage which is fed back via the stray capacitor included in the dynamic winding unit can be equivalently eliminated.

In a further aspect of the present invention, there is provided a stray capacitor cancelling negative feedback circuit comprising: an amplifier unit having non-inverted and inverted input terminals and an output terminal; a winding unit; and a resistor unit which is in series connected to the dynamic focus winding unit, the resistor unit detecting a voltage which is proportional to current flowing through the dynamic focus winding unit. In this case, the voltage which is detected by the resistor unit is fed back to said inverted input terminal of the amplifier unit. At least a compensating capacitor unit is in series connected between the output terminal and the non-inverted input terminal of the amplifier unit to reduce a signal fed back to the amplifier unit via the stray capacitor associated with said dynamic focus winding unit.

The stray capacitor canceling negative feedback circuit may be used for the electromagnetically focused CRT display or the like.

BRIEF DESCRIPTION OF THE DRAWINGS

FIG. 15 is a table showing problems of the prior art.

DESCRIPTION OF THE PREFERRED EMBODIMENTS

A focus yoke, an electromagnetically focused CRT display having the focus yoke and a negative feedback circuit with stray capacitor cancellation means of the present invention will be described with reference to drawings.

Now, principle of the invention will be described for understanding of the present invention.

Figure 2A:
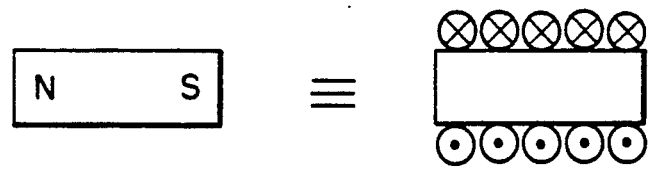
FIGS. 2A and 2B are schematic views illustrating the characteristics of the magnetic field for understanding of the present invention.

FIG. 2A shows that a bar-like permanent magnet in the left side is equivalent to a sheet current on the side surfaces in the right side. This is understood by the fact that the microscopic magnetic properties of the magnet are derived from the microscopic magnetic dipoles (electron spins) and that a set of microscopic magnetic dipoles is equivalent to a set of microscopic eddy currents.

Figure 2B:
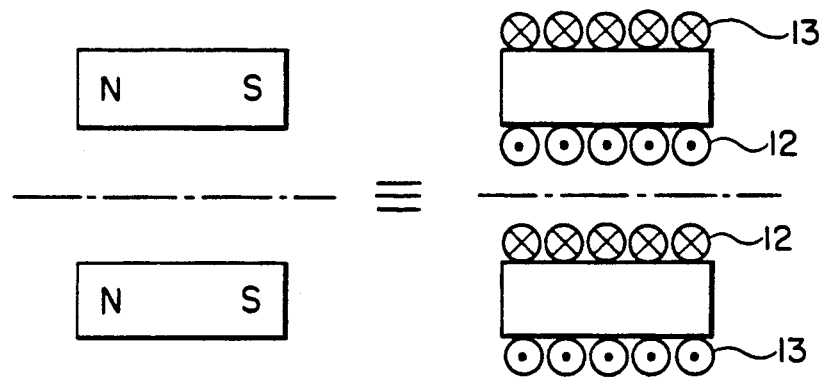

In FIG. 2B, a cylindrical annular magnet which is used for an focus yoke is shown in the left side of the drawing and sheet currents on the side surfaces which are equivalent to the magnet are shown in the right side thereof. A sheet current on the side surfaces 12 is effective to achieve a desired focussing performances and an undesired sheet current 13 will cause a spherical aberration.

Figure 13A:
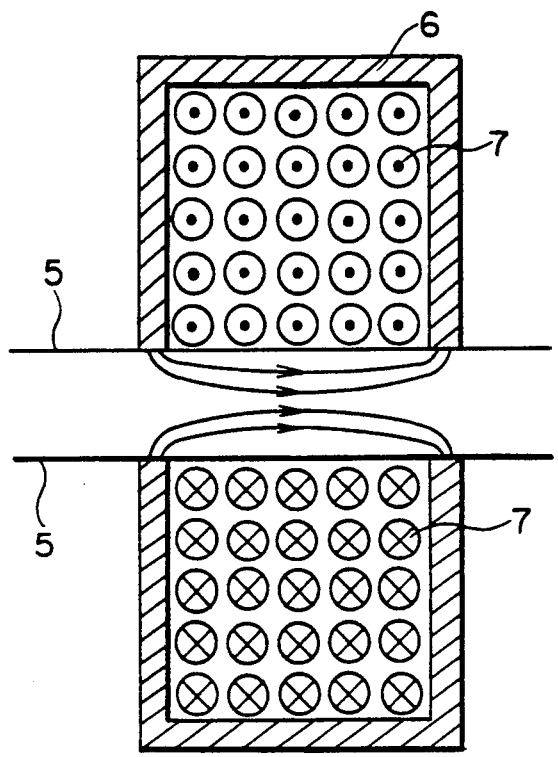
FIG. 13A is a sectional view showing a prior art focus yoke which is of a solenoid current type.
Figure 13B:
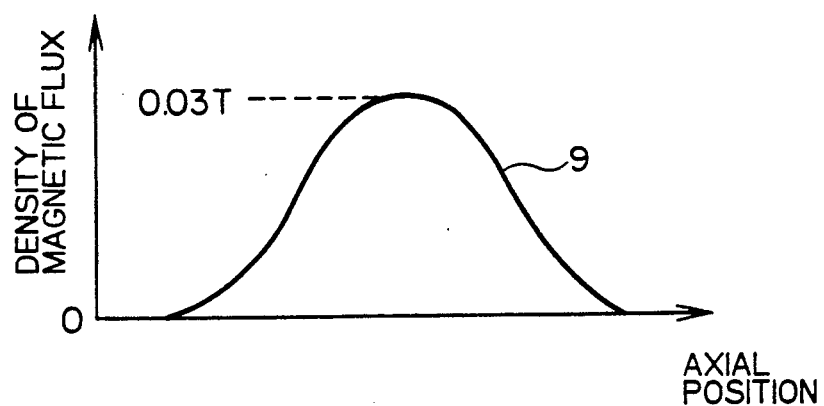
FIG. 13B is a graph showing the distribution of the magnetic field along the axis of the focus yoke.
Figure 14A:
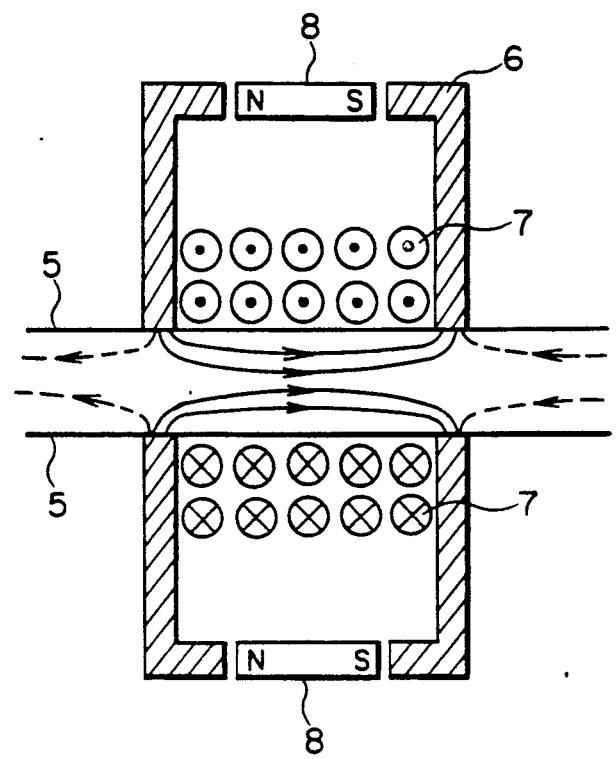
FIG. 14A is a sectional view showing a prior art focus yoke which is of a permanent magnet type.
Figure 14B:
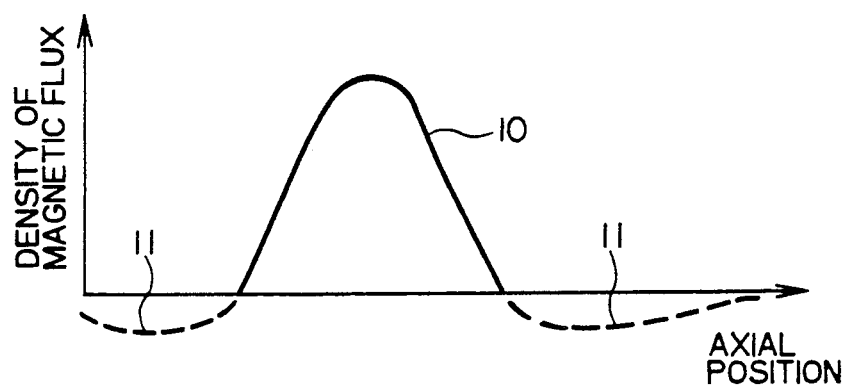
FIG. 14B is a graph showing the distribution of the magnetic field along the axis of the focus yoke.

In order to eliminate the undesired sheet current 13, it suffices to dispose a large solenoid around a core comprising the cylindrical annular magnet. However, it is not so easy to do so. The reason is that the volume of the large solenoid will become larger than that which is required in the above mentioned prior art shown in FIG. 13A.

Figure 1A:
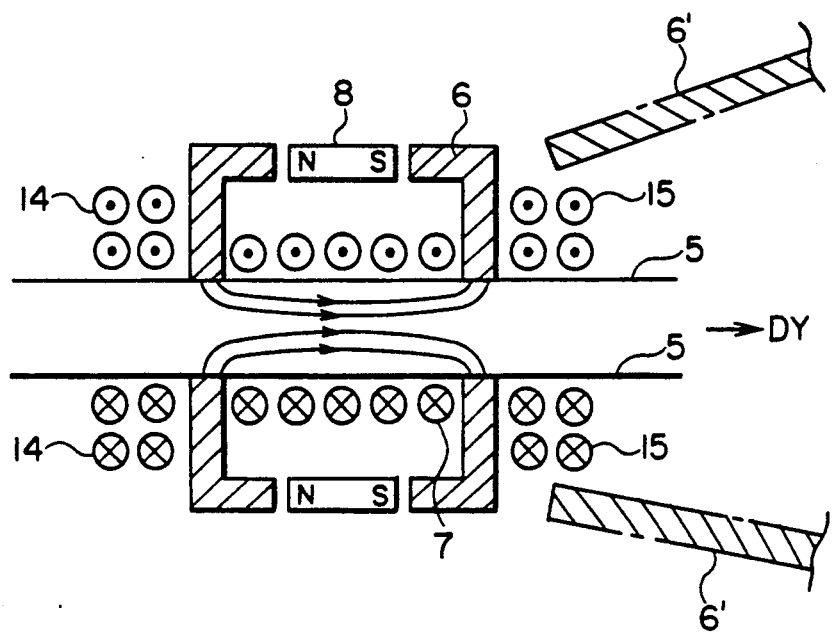
FIG. 1A is a sectional view showing a focus yoke in a first embodiment of the present invention.
Figure 1B:
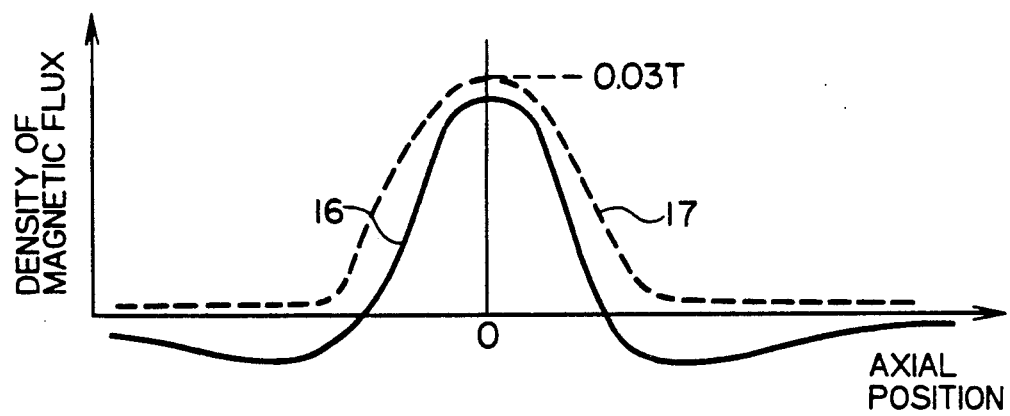
FIG. 1B is a graph showing the distribution of magnetic field along the axis of the focus yoke.

A sectional view showing the structure of a focus yoke in a first embodiment of the present invention and the magnetic field distribution along an axis of the focus yoke are shown in FIGS. 1A and 1B, respectively.

In FIG. 1A, a reference numeral 5 denotes a neck portion of a CRT, 6 denotes a magnetic path forming core, 7 a dynamic focussing winding, 8 a permanent magnet, 14 and 15 windings for the elimination of the undesired magnetic field of the inverse polarity. FIG. 1B is a graph showing the distribution of the magnetic field along the axis of the CRT. Curves 16 and 17 denote the distributions of the magnetic field which is established when the windings 14 and 15 are absent and present, respectively. FIGS. 1A and 1B are relevant to each other in position in the axial direction of the CRT.

In FIG. 1A, the sectional area which is surrounded by the core 6, magnet 8 and the neck portion 5 is for example, about 1 cm by 2 cm which is about a half of the prior art. Therefore, reduction in volume and saving in energy is achieved.

Now, action of the windings 14 and 15 for the elimination of the undesired magnetic field of the inverse polarity will be described.

As is apparent from the curve 16 in FIG. 1B, a magnetic field is generated similarly to the prior art permanent magnet type if the windings 14 and 15 for the elimination of the undesired magnetic field of the inverse polarity are not provided. In contrast to this, as is apparent from the curve 17 in FIG. 1B, the undesired magnetic field with the inverse polarity can be eliminated if the windings 14 and 15 for the elimination of the undesired magnetic field of the inverse polarity are provided and a current (current having at least a d.c. component or a non-alternating current) is conducted through the windings 14 and 15.

Therefore, deterioration in focussing (spherical aberration) which has heretofore occurred due to the undesired magnetic field of the inverse polarity can be eliminated in accordance with the present invention. Since the windings 14 and 15 for the elimination of the undesired magnetic field of the inverse polarity are disposed in both sides of the magnetic path forming core 6, the diameters of the winding 14 and 15 are reduced. Thus, the windings 14 and 15 are capable of effectively generating a magnetic field for the elimination of the undesired magnetic field of the inverse polarity.

In the present embodiment, one of the windings 14 and 15 for the elimination of the undesired magnetic field of the inverse polarity may be omitted. Even if the winding 15 in the side of the deflection yoke is omitted, there is no large difference since a core 6' which is included in a part of usual deflection yoke will shield the undesired magnetic field of the inverse polarity which tends to be generated in the neck 5. That is, the cores 6 and 6' are magnetically coupled to each other so that generation of the undesired magnetic field of the inverse polarity in the deflection yoke side is reduced.

The first embodiment has been described. Now, a second embodiment will be described.

Figure 3:
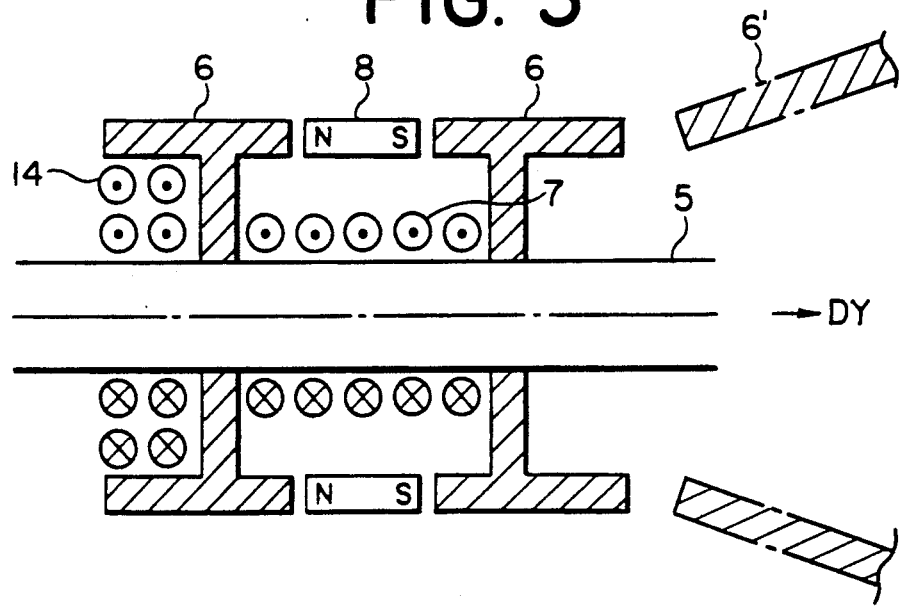
FIG. 3 is a sectional view showing the sectional structure of a focus yoke in another embodiment of the present invention.

A sectional structure of an focus yoke of a second embodiment of the present invention is shown in FIG. 3. The present embodiment has a feature that the shape of a magnetic path forming core 6 is modified so that the core 5 extends to an area where the dynamic focus winding 7 does not exist unlike the above mentioned first embodiment. This feature enables to enhance the magnetic field forming efficiency of the winding 14 for the elimination of the magnetic field of the inverse polarity.

Illustration of the winding 15 in the deflection yoke side is omitted in the drawings. Even if the winding 15 is omitted, the shielding action of the extended core 6 enables to reduce the strength of the undesired magnetic field of the inverse polarity.

The second embodiment has been described.

Figure 4:
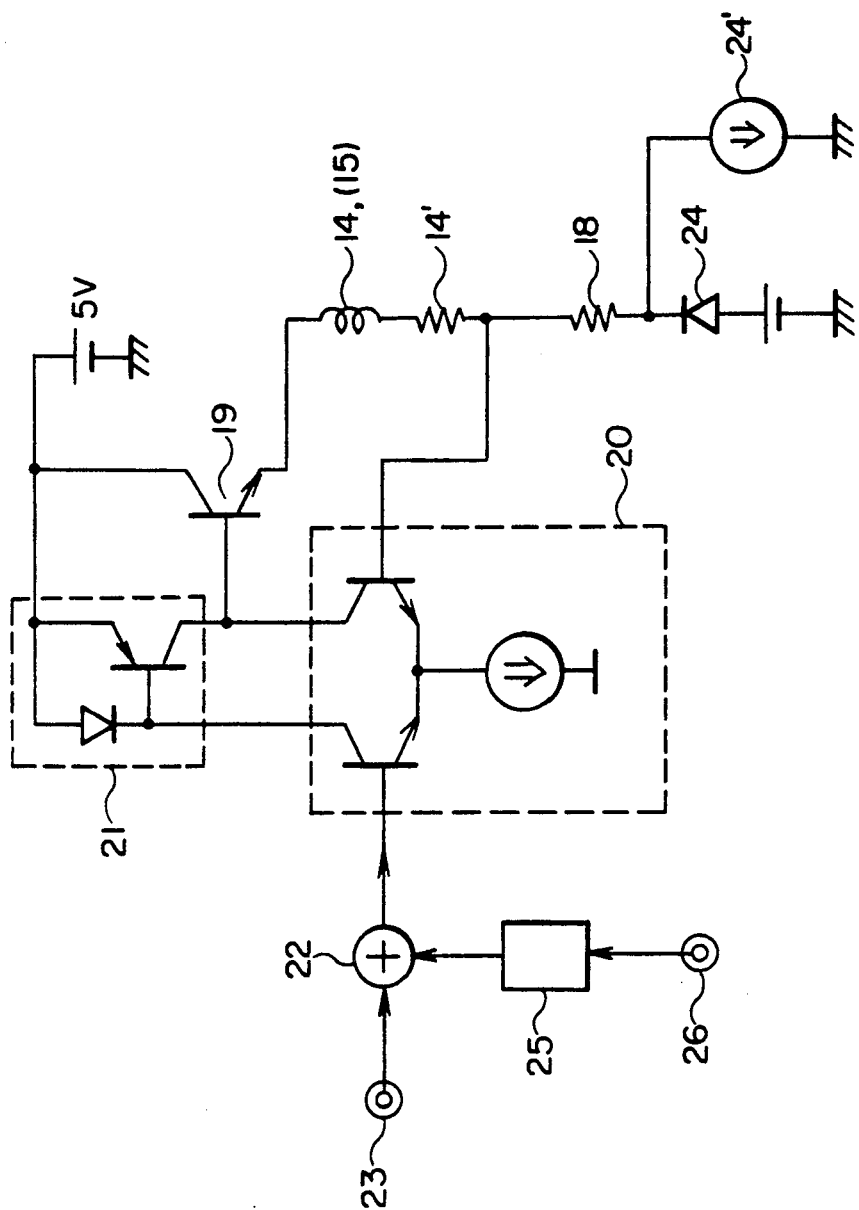
FIG. 4 is a circuit diagram showing an example of a drive circuit for conducting a current through a winding for the elimination of the undesired magnetic field of the inverse polarity.

An example of the drive circuit for conducting a current through the winding 14 or 15 for the elimination of the undesired magnetic field of the inverse polarity which is illustrated in FIG. 1A or 3 is shown in FIG. 4.

In FIG. 4, a reference numeral 14 (15) denotes a winding for the elimination of the undesired magnetic field of the inverse polarity, 14' a loss resistor existing in the winding 14 of the elimination of the undesired magnetic field of the inverse polarity, 18 a current detecting resistor for detecting the current flowing through the winding for the elimination of the undesired magnetic field of the inverse polarity, 19 a voltage follower, 20 a differential amplifier, 21 a current Miller circuit, 22 an adder, 23 an input terminal for inputting a reference voltage, 24 a temperature detecting diode, 24' a constant current source for causing a constant current to flow through the diode 24, 25 a voltage transmission ratio presetting circuit, and 26 a correcting voltage terminal. Operation of the voltage transmission ratio presetting circuit 25 and the correcting voltage terminal 26 will be hereafter described separately with reference to the other drawing.

In the present embodiment, a circuitry comprising components represented by reference numerals 18, 20, 21, 19, 14, 14' in FIG. 4 forms a negative feedback loop, which will operate as follows:

When the current flowing through the winding 14 for the elimination of the undesired magnetic field of the inverse polarity becomes excessive, the voltage potential of the current detecting resistor 18 will become excessive, so that the output voltage potentials of the differential amplifier 20 and the current Miller circuit 21 will fall. This causes the output voltage potential of the voltage follower 19 to fall to present the current flowing through the winding 14 from becoming excessive. Accordingly, the current flowing through the winding 14 is controlled in such a manner that it is proportional to the voltage applied to the input terminal 23. In other words, the present circuit function as magnetic field control means.

Now, compensation for the thermal characteristics of the magnet 8 will be described.

The magnetic field which is generated for the magnet 8 will decrease with the elevation in temperature. The decreasing coefficient is about −2000 PPM/°C. On the other hand, the thermal coefficiency of the voltage across the diode 24 is about −2500 PPM/°C. Accordingly, compensation for the thermal characteristics of the magnet 8 can be substantially achieved by mounting the diode 24 in the vicinity of the focus yoke.

Figure 5:
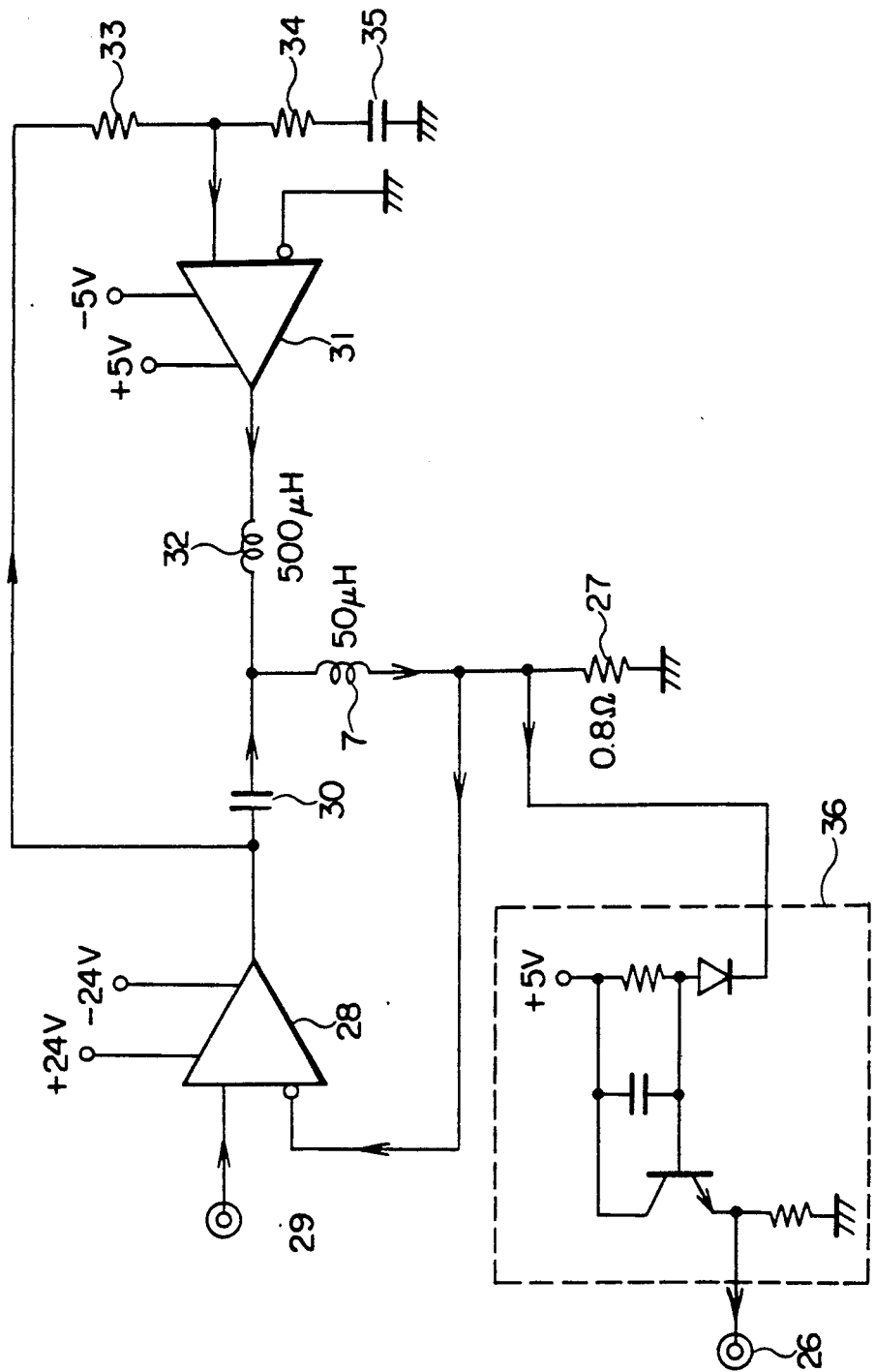
FIG. 5 is a circuit diagram showing an example of a drive circuit for conducting a current through a dynamic focus winding.

An example of the drive circuit for conducting a current through the dynamic focus winding 7 shown in FIG. 1A or 3 is shown in FIG. 5. In this example, the dynamic focus winding 7 is commonly used and is controlled by a shunt drive method based upon two sets of voltage sources.

In FIG. 5, a reference numeral 27 denotes a current detecting resistor, 28 a high frequency (horizontal scanning frequency) dynamic focus negative feedback amplifier, 29 an input terminal, 30 a low frequency blocking capacitor, 31 a low frequency (vertical scanning frequency) dynamic focus negative feedback amplifier, 32 a high frequency blocking choke coil, 33 and 34 resistors, 35 a capacitor and 36 a peak detecting circuit. The resistors 33 and 34 and the capacitor 35 form a low pass filter.

The high frequency dynamic focus negative feedback amplifier 28 is operative at high voltages ±24 V. The low frequency dynamic focus negative feedback amplifier 31 is operative at low voltages ±5. Operation of the peak detecting circuit 36 will be described hereafter.

It will be described hereafter that the current flowing through the dynamic focus winding 7 is controlled in such a manner that it is proportional to the potential at the input terminal 29.

If it is assumed that the current flowing through the dynamic focus winding 7 be excessive, the potential at the current detecting resistor 27 would become excessive. Accordingly, the output potential of the negative feedback amplifier 28 is lowered. The high frequency component in the lowered output potential will decrease the current flowing through the dynamic focus winding 7 via the capacitor 30. In other words it will act to prevent the assumed excessive increase in the current.

On the other hand, the low frequency component in the lowered output voltage from the negative feedback amplifier 28 is applied to the negative feedback amplifier 31 via the low pass filters 33, 34 and 35 for lowering the output voltage from the negative feedback amplifier 31. As a result of this, a current flowing to the dynamic focus winding 7 via the choke coil 32 is decreased. That is, the assumed excessive increase in the current is prevented.

Therefore, the current flowing through the dynamic focus winding 7 is controlled in such a manner that it is proportional to the wave form of the voltage at the input terminal 29.

The inductance of the choke coil 32 is selected as about ten times as high as that of the dynamic focus winding 7. Most of the high frequency current flowing via the capacitor 30 will flow through the dynamic focus winding 7. The low frequency current will be blocked by the capacitor 30. Accordingly, most of the low frequency current is supplied from the negative feedback amplifier 31.

The power supply voltages (±5) for the negative feedback amplifier 31 are about 20% of those of the negative feedback amplifier 28. Therefore, the consumed power (the product of the power supply voltage and the current) which is necessary to conduct the low frequency current through the dynamic focus winding 7 is reduced to about 20%. In an application of the drive circuit to a CRT display having a horizontal scanning frequency of 140 kHz, the inductance of the dynamic focus winding 7 is about 50 $\mu$H, the choke coil 32 is 500 $\mu$H, the horizontal dynamic focus current is 1.3 App.

If the negative feedback amplifier 31 in which the output is of a current supply output type is used, the high frequency blocking choke coil 32 may be omitted.

Figure 6A:
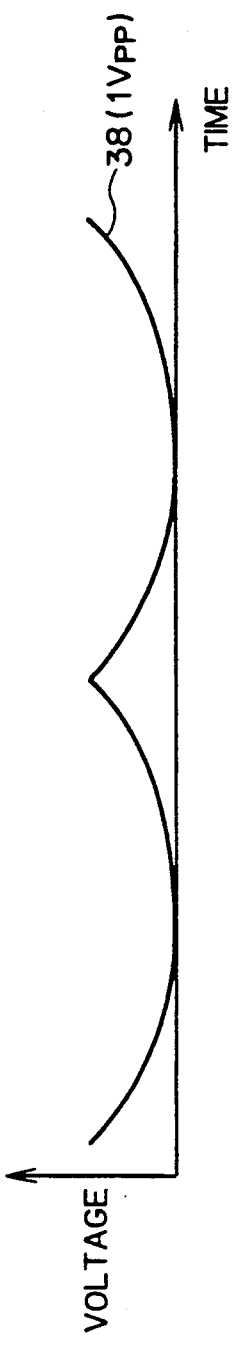
FIG. 6A is a wave form view showing an example of a low frequency parabolic wave.

An example of a wave form of the voltage which is applied to the input terminal 29 in FIG. 5 is shown in FIG. 6A.

Figure 6B:
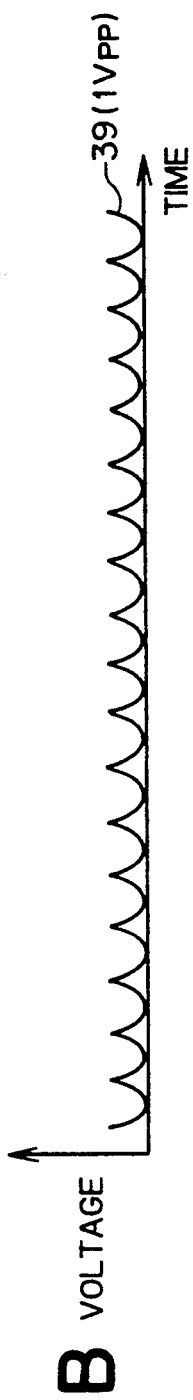
FIG. 6B is a wave form view showing an example of a high frequency parabolic wave.
Figure 6C:
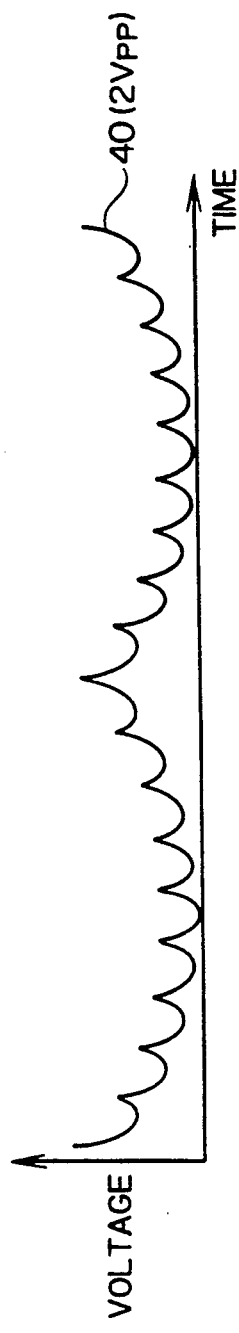
FIG. 6C is a wave form view showing an example of a voltage applied to an input terminal in FIG. 5.

A voltage having a wave form 40 shown in FIG. 6C is applied to the input terminal 29 in FIG. 5. The wave form 40 is obtained by adding a wave form 38 shown in FIG. 6A to a wave form 39 shown in FIG. 6B. The wave form 38 denotes a low frequency parabolic wave having a vertical scanning period. The wave form 39 denotes a high frequency parabolic wave having a horizontal scanning frequency.

Figure 7:
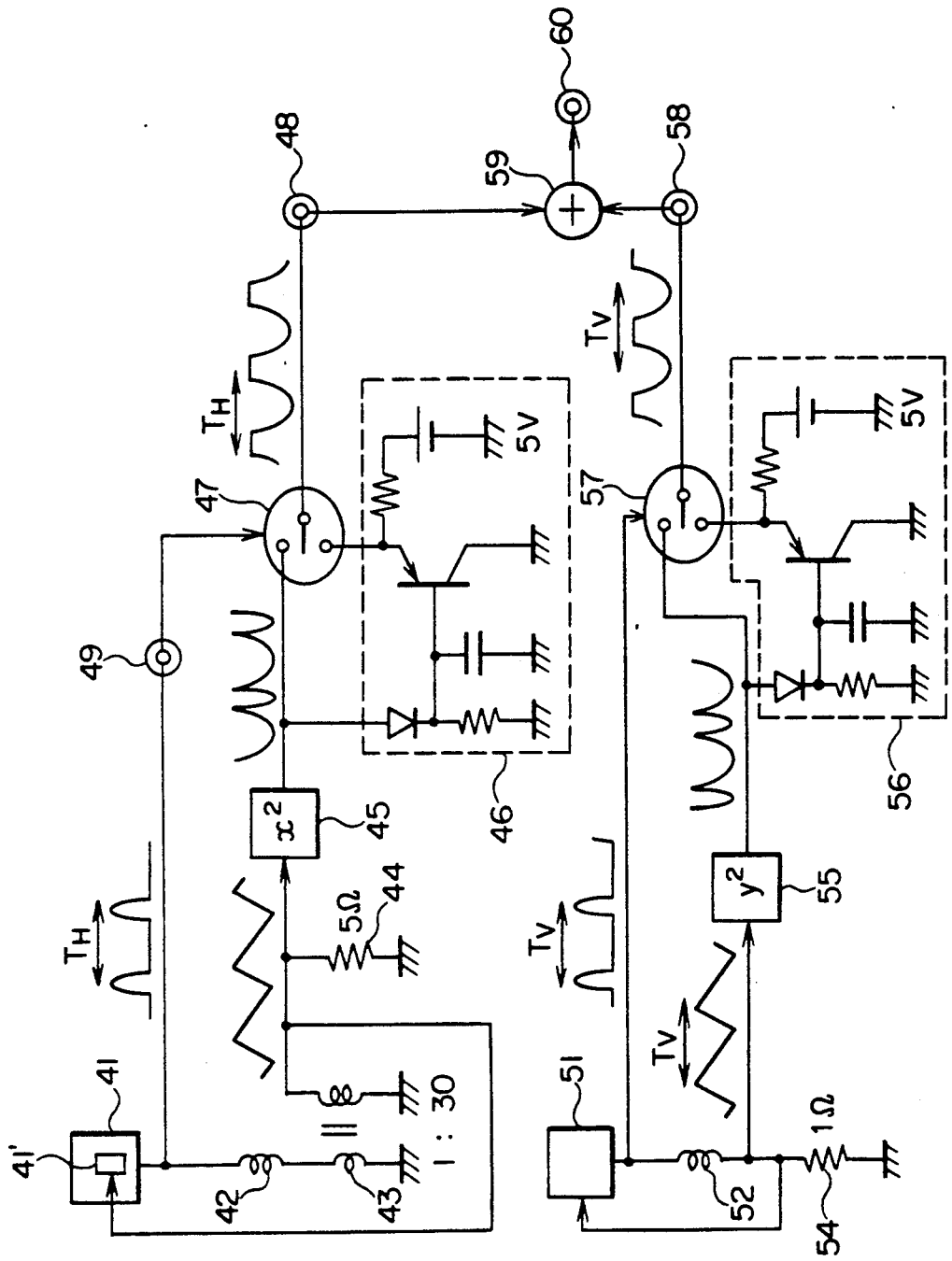
FIG. 7 is a circuit diagram showing an example of a circuit for generating a signal to be supplied to the input terminal in FIG. 5.

An example of a circuit for generating signals to be supplied to the input terminal 28 in FIG. 5 is shown in FIG. 7. This circuit is properly formed so that it is used together with the example shown in FIG. 5.

In FIG. 7, a reference numeral 41 denotes a horizontal deflection circuit, 51 a vertical deflection circuit, 42 a horizontal deflection coil, 52 a vertical deflection coil, 43 a current detecting transformer, 44 a resistor for detecting the horizontal deflection current, 54 a resistor for detecting the vertical deflection current, 45 and 55 squaring circuits each which may comprise a commercially available multiplier having two inputs to which the same signals are input, 46 and 56 peak detecting circuits, 47 and 57 analog switches, 48 and 58 output terminals, 49 a terminal, 59 an adding circuit, and 60 an output terminal.

Operation of the generating circuit will now be described.

In FIG. 7, a saw-tooth voltage which is proportional to the horizontal deflection current is detected across the detecting resistor. The detected voltage is used as a saw-tooth signal to a horizontal AFC circuit 41' in the horizontal deflection circuit 41 and is simultaneously input to the squaring circuit 45 for generating a parabolic wave of the horizontal scanning period.

A desired component which falls in the horizontal scanning period which is included in the parabolic wave is output to the output terminal 48 as it is.

On the other hand, undesired component in the horizontal retrace period included in the parabolic wave is replaced with the output of the peak detecting circuit 46 during a period of a horizontal retrace pulse at the terminal 49 by the analog switch 47 and is output to the output terminal 48.

A saw-tooth voltage which is proportional to the vertical deflection current is detected across the detecting resistor 54. The detected voltage is used as a negative feedback voltage to the vertical deflection circuit 51 and is in parallel input to the squaring circuit 55 for outputting a parabolic wave of a vertical scanning period.

Operation of the analog switch 57 and the peak detecting circuit 56 is similar to that of the above mentioned analog switch 47 and the peak detecting circuit 46.

It is understood that signals having the wave forms 39 and 38 which are' shown in FIGS. 6A and 6B are obtained at the output terminals 48 and 58. Accordingly, a signals having the wave form 40 shown in FIG. 6C is obtained at the output terminal 60 of the adder 59 shown in FIG. 7.

Coupling between the output terminal 60 shown in FIG. 7 and the input terminal 29 shown in FIG. 5 can be either of an AC-coupled type or of a DC restoration type.

Figure 8:
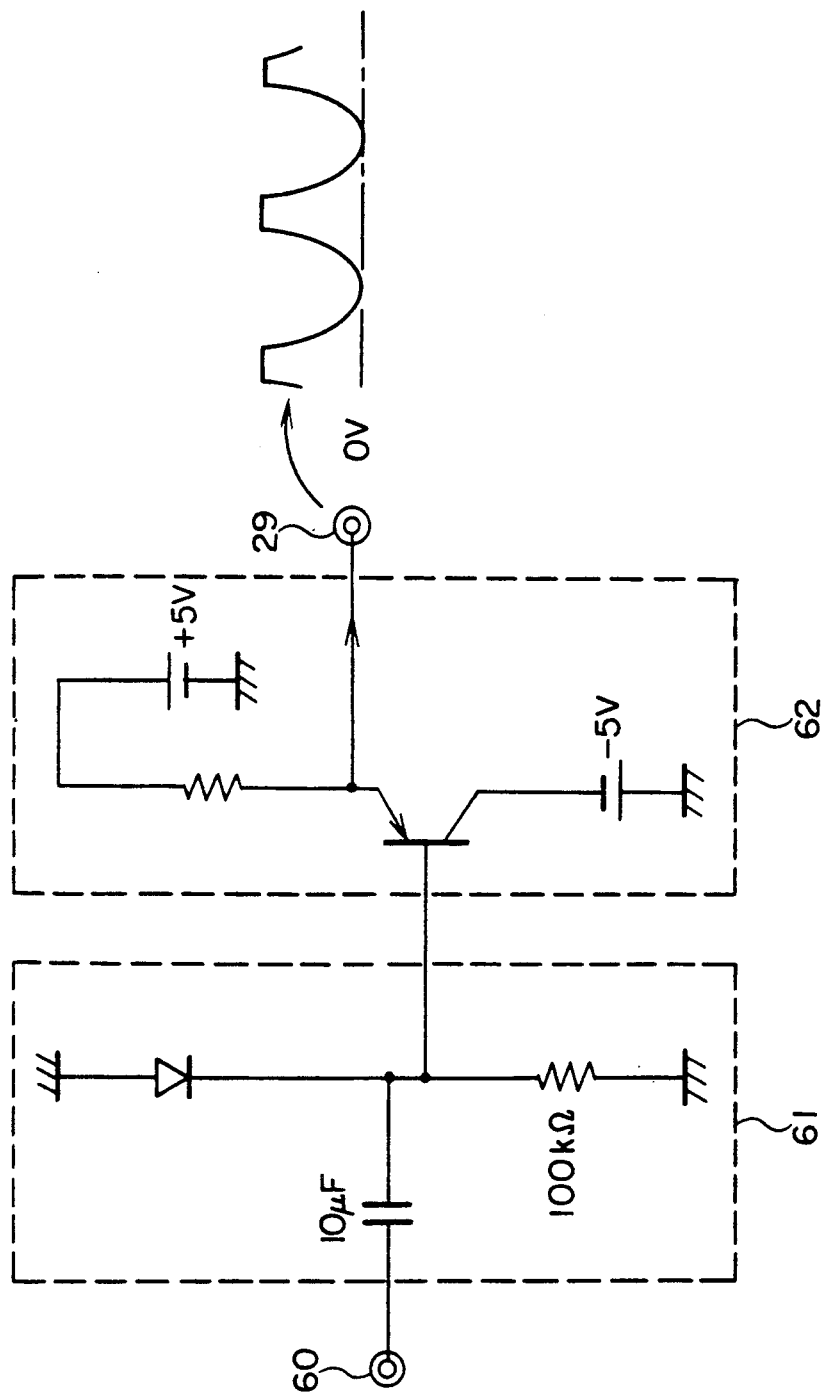
FIG. 8 is a circuit diagram showing an example of a coupling circuit which is of a DC-restoration type for coupling an input terminal in FIG. 7 to the input terminal in FIG. 5.
Figure 9:
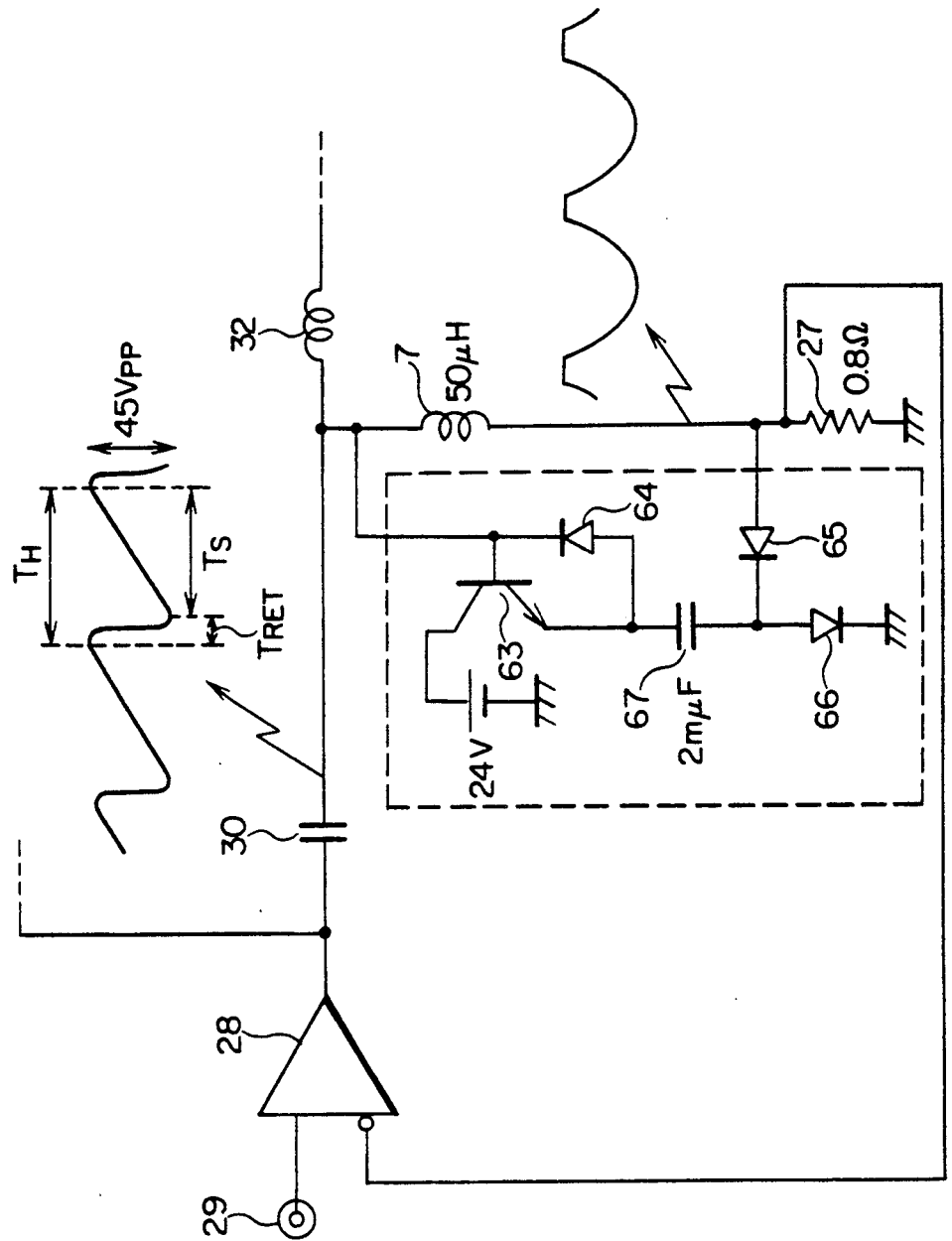
FIG. 9 is a circuit diagram showing a main part of another example of a drive circuit for conducting a current through the dynamic focus winding.

A coupling circuit which is of the DC restoration type is shown in FIG. 8. In the drawing, the output and input terminals 60 and 29 has been described. A reference numerals 61 and 62 denote a minimum voltage clamping circuit and a voltage follower, respectively. An output voltage in which the minimum voltage is clamped at a fixed potential (the ground potential in this example) is obtained at the input terminal 29. If the coupling circuit shown in FIG. 9 is used, the adder 22 and the voltage ratio presetting circuit in FIG. 4 and the peak detecting circuit in FIG. 5 would be unnecessary.

When the amplitude of the parabolic wave is adjusted in a practical application, the coupling circuit which is of the AC coupled type has the following advantage and disadvantage. The advantage resides in that the average of the positive and negative amplitudes of the parabolic wave is zero if the amplitude of the parabolic wave is increased or decreased, the negative feedback amplifier 31 shown in FIG. 5 is prevented from being overloaded. The disadvantage is related with the fact that the minimum potential at the central position of the parabolic wave corresponds to the central positionon a screen, that is, the fact that the focus condition in the central area on a screen influenced by the increase and decrease in the amplitude of the parabolic wave. Accordingly, it is preferable that any of the focus condition in the peripheral area of the screen is changed and the focus condition in the central area on the screen be kept unchanged even if the amplitude of the parabolic wave is increased or decreased.

In order to keep the focus condition in the central area on the screen in such a manner, the above mentioned voltage transmission ratio presetting circuit 25 and peak detecting circuit 36 which are shown in FIGS. 4 and 5, respectively function as follows:

The peak detecting circuit 36 shown in FIG. 5 generates a correction voltage which is proportional to a peak value (corresponding to the central area on the screen) of the current flowing through the dynamic focus winding 7. The correction voltage is applied to the voltage transmission ratio presetting circuit 25 shown in FIG. 4 via the output terminal (correction voltage terminal) 26 to conduct a correction current through the winding 14 (15) for the elimination of the undesired magnetic field of the inverse polarity. The correction current will act to correct the change in the focus condition in the central area on the screen. Accordingly, only the focus condition in the peripheral area of the screen is adjusted depending upon the increase or decrease in the amplitude of the parabolic wave.

A main part of the another example of a drive circuit for conducting a current in the dynamic focus winding 7 in the foregoing first and second embodiments is shown in FIG. 9. This example is a modification of the above mentioned drive circuit shown in FIG. 5. In this example, undesired parasitic ringing due to a stray capacitor associated with the dynamic focus winding 7 can be reduced. The drive circuit of FIG. 9 is different from that of FIG. 5 in that the peak detecting circuit 36 in FIG. 5 is omitted and a part surrounded by a dotted line is added in FIG. 9.

In FIG. 9, a capacitor 67 has a capacitance C which is selected so that the capacitance C and the inductance (L) of the dynamic focus winding 7 define an resonant period which is a substantially half of the horizontal retrace period ($T_{RET}$). In other words, the value of the capacitor 67 is selected so that the resonation period defined by the capacitor 67 and the inductance of the winding 7 is substantially half of the horizontal retrace period ($T_{RET}$). Specifically, the value C of the capacitor 67 is selected to a value which is close to $(T_{RET})^2/\pi^2 L$. For example, in case in which the horizontal frequency is 140 kHz, the horizontal retrace period ($T_{RET}$) is 1 $\mu$s, the inductance L of the dynamic focus winding 7 is 50 $\mu$H, the value C of the capacitor is selected 2000 pF.

In FIG. 9, a reference numeral 63 denotes a voltage follower, 64, 65 and 66 denote diodes. Operation of the drive circuit shown in FIG. 9 will be described.

The input voltage potential to the voltage follower 63 gradually increases in the horizontal scanning period (Ts). In this period (Ts), a current from the voltage follower 63 which will charge the capacitor 69 flows through the diode 66 and the diode 65 is turned off. Accordingly, an additional circuit surrounded by a dotted line is independent of the other circuits.

On the other hand, the voltage on the input terminal of the voltage follower 63 falls in the horizontal retrace period. Accordingly, the voltage follower 63 and the diode 66 are turned off and the diodes 64 and 65 are turned on. That is, the capacitor 67 is connected in parallel with the dynamic focus winding 7. Therefore, the dynamic focus winding 7 and the capacitor 67 resonate at a period which is a half of the horizontal retrace period ($T_{RET}$). The resonant current in the resonant period causes the voltage across the capacitor 67 to be discharged from the maximum voltage to the minimum voltage. At this time, the current flowing through the current detecting resister 27 will not change. Therefore, the voltage across the resistor 27 is kept constant in the horizontal retrace period ($T_{RET}$).

Undesired parasitic ringing occurring immediately after start and completion of the horizontal retrace period ($T_{RET}$) is thus suppressed. The wave form in the horizontal retrace period ($T_{RET}$) is a simple sinusoidal wave shown in FIG. 9.

Figure 10:
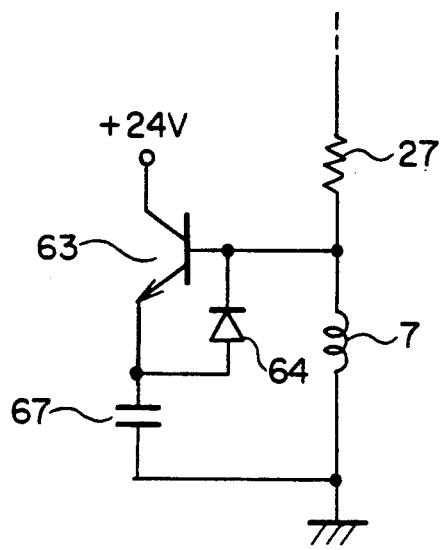
FIG. 10 is a circuit diagram showing a modification of the drive circuit in FIG. 9.

The diodes 65 and 66 are necessary in the example of FIG. 9 since they prevent the current flowing to the capacitor 62 from flowing to the current detecting resistor 27. In a circuit arrangement in which the current detecting resistor 27 is not used or the current detecting resistor 27 is disposed in difference location, the diodes 65 and 66 may be omitted as shown in FIG. 10.

Figure 11:
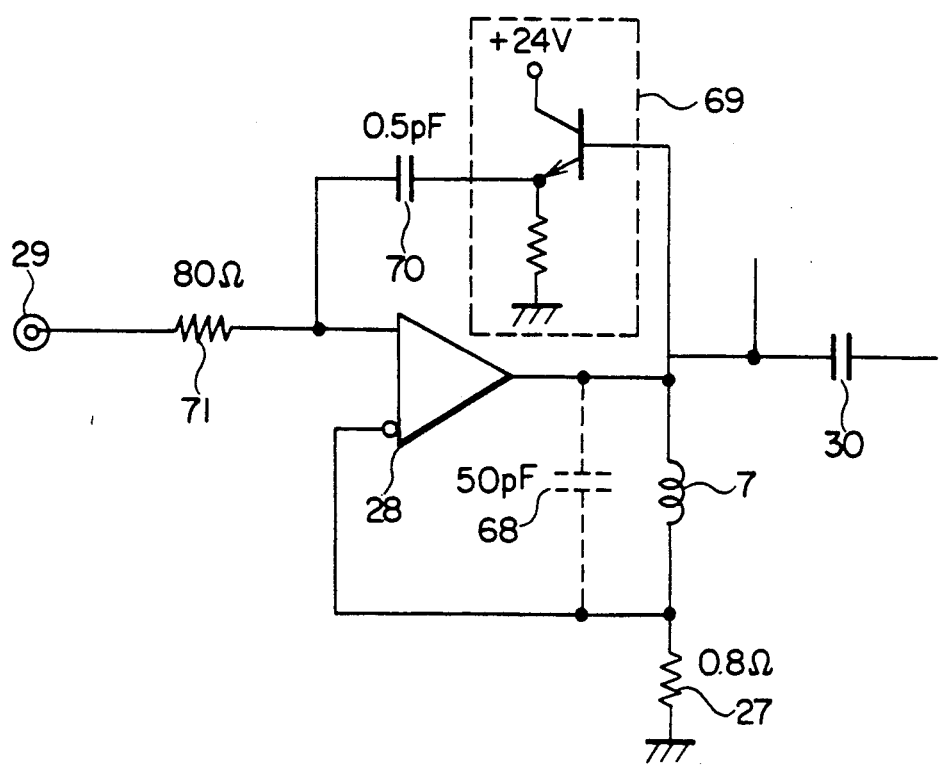
FIG. 11 is a circuit diagram showing an example of a negative feedback circuit with stray capacitor eliminating means for equivalently eliminating the stray capacitor in the dynamic focus winding.
Figure 12:
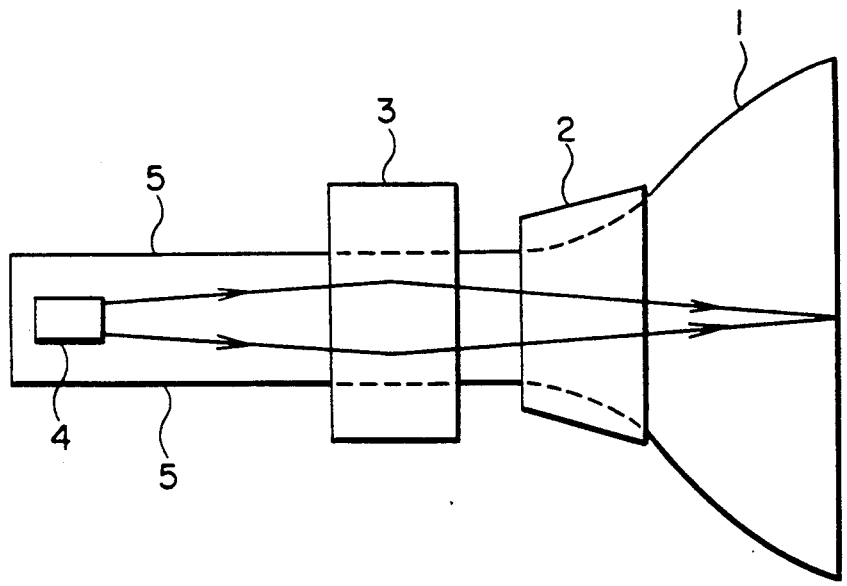
FIG. 12 is a schematic view showing a general CRT and peripheral components.

An example of a negative feedback circuit with stray capacitor cancellation means which equivalently eliminates the stray capacitor of the dynamic focus winding 7 shown in FIG. 1A or 3 is shown in FIG. 11. This example is a local modification of the example shown in FIG. 5.

In FIG. 11, a reference numeral 68 denotes a stray capacitor of the winding 7, 69 a voltage follower, 70 a capacitor for supplying a current with an inverse polarity, 71 a signal source resistor. The example of FIG. 11 is different from the example of FIG. 5 only in that the voltage follower 69, the capacitor 70 and the resistor 71 are added.

In the example shown in FIG. 11, equivalent cancellation of the stray capacitor is achieved by making the product of the resistor 71 and the capacitor 70 equal to the product of the resistor 27 and the capacitor 68 (time constant). Specific parameters are represented in FIG. 11. The voltage follower 69 shown in FIG. 11 may be omitted. Generally speaking, equivalent cancellation of the stray capacitance is achieved by capacitively coupling a voltage applied to the dynamic focus winding 7 to an input terminal having an polarity opposite to that of the input terminal of the negative feedback amplifier to feed back the voltage across the current detecting resistor 27.

As mentioned above with reference to FIG. 1A, the present invention has an advantage that spherical aberration is reduced by decreasing the undesired magnetic field due to equivalent sheet current on the outer side of a permanent magnet by means of winding means for the elimination of the undesired magnetic field of the inverse polarity. Particularly, if the amplitude of the magnetic field of the inverse polarity is reduced less than a half, the advantage of the present invention is remarkable. This is because the converging force of the magnetic field is proportional to the energy of the magnetic field as is commonly known. Accordingly, the converging force due to undesired magnetic field of the inverse polarity can reduced to a quarter if the strength of the undesired magnetic field of the inverse polarity is reduced to a half. In accordance with the present invention, an inner useless volume surrounded by a core is reduced to reduce the consumed power.

In accordance with the present invention, the undesired magnetic field of the inverse polarity can be reduced by extending a magnetic pass forming core externally of a dynamic focus magnetic path as described with reference to FIG. 3.

In accordance with the present invention, a magnetic field for the elimination of the undesired magnetic field of the inverse polarity is generated by the winding means for the elimination of the undesired magnetic field of the inverse polarity and the thermal characteristics of the permanent magnet is compensated for as described with reference to FIG. 4.

In accordance with the present invention, the dynamic focus winding means can be efficiently supplied with a high frequency current as described with reference to FIGS. 5, 7 and 9.

In accordance with the present invention, in a typical arrangement in which a current flowing through winding means is controlled in a negative feedback basis as described with reference to FIG. 11, the control of a control system can be enhanced by equivalently canceling a feedback current flowing through a stray capacitor included in the winding means.

It is to be understood that the present invention is not limited to only the above mentioned embodiments.

For example, the windings 14, 15 for the elimination of the undesired magnetic field of the inverse polarity shown in FIGS. 1A and 3A may be supplied with a low frequency dynamic focus current and the dynamic focus winding 7 shown in FIG. 3A may be supplied with a high frequency dynamic focus current.

The dynamic focus winding 7 shown in FIG. 1A or 3 may comprise two sets of windings. One set of the windings is supplied with the low frequency dynamic focus current and the other set of the winding is supplied with the high frequency dynamic focus current.

We claim:

1. A focus yoke used for an electromagnetically focused CRT display comprising:
    cylindrical permanent magnet means which is disposed around a neck portion of a CRT and is spaced from the circumference of the neck portion;
    core means for defining a toroidal space together with said cylindrical magnet means for substantially surrounding said neck portion and for forming a magnetic path to guide magnetic lines of force generated by said cylindrical permanent magnet means;
    dynamic focus winding means disposed in said toroidal space; and
    eliminating winding means disposed externally of said toroidal space for eliminating an undesired magnetic field of an inverse polarity generated due to said cylindrical permanent magnet means.

2. A focus yoke as defined in claim 1, wherein said eliminating winding means is disposed adjacent to at least one side of said core means in an axial direction of said neck portion.

3. A focus yoke as defined in claim 1, wherein said core means includes an extension which extends in at least one direction externally of said toroidal space substantially in parallel with the axis of said neck portion.

4. A focus yoke as defined in claim 3, wherein said CRT display has a magnetic member disposed around said neck portion, which is magnetically coupled with said extension.

5. A focus yoke as defined in claim 1, wherein said dynamic focus winding means is supplied with a high frequency dynamic focus current, said eliminating winding means is supplied with a low frequency dynamic focus current, whereby said eliminating winding means provides a low frequency dynamic focusing.

6. An electromagnetically focused CRT display including a focus yoke, said focus yoke comprising:
    cylindrical permanent magnet means which is disposed around a neck portion and is spaced from the circumference of the neck portion;
    core means for defining a toroidal space together with said cylindrical permanent magnet means for substantially surrounding said neck portion and for forming a magnetic path to guide magnetic lines of force generated by said cylindrical permanent magnet means;
    dynamic focus winding means disposed in said toroidal space; and
    eliminating winding means disposed externally of said toroidal space for eliminating an undesired magnetic field of an inverse polarity generated due to said cylindrical permanent magnet means.

7. An electromagnetically focused CRT display as defined in claim 6, further including first driving means for applying a current having at least a direct current component to said eliminating winding means.

8. An electromagnetically focused CRT display as defined in claim 7, wherein said first drive means includes temperature compensating means for compensating for thermal characteristics of said cylindrical magnet means.

9. An electromagnetically focused CRT display as defined in claim 8, wherein said temperature compensating means includes a diode.

10. An electromagnetically focused CRT display as defined in claim 6, wherein said first drive means also applies a low frequency dynamic focus current to said eliminating winding means, and
    said first drive means applies a high frequency dynamic focus current to said dynamic focus winding means.

11. An electromagnetically focused CRT display as defined in claim 6, further including second drive means for applying at least a high frequency current of parabolic wave shape having a horizontal scanning period to said dynamic focus winding means.

12. An electromagnetically focused CRT display as defined in claim 11, wherein said second drive means includes a low frequency blocking capacitor which is connected in series with said dynamic focus winding means.

13. An electromagnetically focused CRT display as defined in claim 11, wherein said second drive means comprises:
    first amplifier means which is operated at a first power supply voltage;
    second amplifier means which is operative at a second power supply voltage which is lower than the first power supply voltage, the output of said second amplifier means being adapted to substantially drive said dynamic focus winding means;
    a low frequency blocking capacitor which is connected in series between the output of said first amplifier means and said dynamic focus winding means; and
    low pass filter means for low-pass-filtering the output of said first amplifier means, the output of said low pass filtering means being connected with the input of said second amplifier means.

14. An electromagnetically focused CRT display as defined in claim 11, wherein said second drive means includes means for generating a signal corresponding to said high frequency current of a parabolic wave shape; said generating means comprising:
  resistor means for detecting a voltage which is proportional to a current flowing through a horizontal deflection coil;
  squaring circuit means for squaring the voltage detected by said resistor means; and
  means for outputting the output of said squaring circuit means in a period other than the horizontal retrace period and for outputting a predetermined value in the horizontal retrace period.

15. An electromagnetically focused CRT display as defined in claim 14, wherein said voltage which is detected by said resistor means is used as a saw-toothed wave for a horizontal automatic frequency control circuit.

16. An electromagnetically focused CRT display as defined in claim 11, further including means for allowing a focus condition in a peripheral area of a screen to be adjusted depending upon a change of an amplitude of said high frequency current of parabolic wave shape and for keeping the fixed focus condition in a central area of the screen independently of the change in amplitude of said current.

17. An electromagnetically focused CRT display as defined in claim 11, further including:
  capacitor means which resonates with an inductance of said dynamic focus winding means when said capacitor means is connected in parallel with said dynamic focus winding means; and
  switching means for connecting said capacitor means in parallel with said dynamic focus winding means only in the horizontal retrace period.

18. An electromagnetically focused CRT display as defined in claim 11, wherein said second drive means includes:
  amplifier means having non-inverted and inverted input terminals and an output terminal; and
  resistor means which is connected in series with said dynamic focus winding means for detecting a voltage which is proportional to current flowing through said dynamic focus winding means;
  wherein the voltage detected by said resistor means is fed back to said inverted input terminal of said amplifier means; and
  at least a compensating capacitor means is connected in series between said output terminal and said non-inverted input terminal of said amplifier means to reduce a signal fed back to said amplifier means via a stray capacitor associated with said dynamic focus winding means.

19. A stray capacitor canceling negative feedback circuit comprising:
  amplifier means having non-inverted and inverted input terminals and an output terminal;
  winding means connected to the output terminal of said amplifier means;
  resistor means which is connected in series with said winding means for detecting a signal which is proportional to current flowing through said winding means;
  means for feeding back the signal which is detected by said resistor means to said inverted input terminal of said amplifier means; and
  at least a compensating capacitor means connected in series between said output terminal and said non-inverted input terminal of said amplifier means to cancel a portion of the signal fed back to said amplifier means caused by stray capacitance existing in parallel with said winding means.

* * * * *